US012417924B2

United States Patent

(12) United States Patent
Chen et al.

(10) Patent No.: US 12,417,924 B2
(45) Date of Patent: Sep. 16, 2025

(54) FORMATION OF SELF-ASSEMBLED MONOLAYER FOR SELECTIVE ETCHING PROCESS

(71) Applicant: TAIWAN SEMICONDUCTOR MANUFACTURING COMPANY, LTD., Hsinchu (TW)

(72) Inventors: Yi-Hsiu Chen, Hsinchu (TW); Kenichi Sano, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 434 days.

(21) Appl. No.: 18/153,556

(22) Filed: Jan. 12, 2023

(65) Prior Publication Data

US 2024/0105462 A1 Mar. 28, 2024

Related U.S. Application Data

(60) Provisional application No. 63/405,985, filed on Sep. 13, 2022.

(51) Int. Cl.
*H01L 21/311* (2006.01)
*H01L 21/02* (2006.01)

(52) U.S. Cl.
CPC .. *H01L 21/31144* (2013.01); *H01L 21/02126* (2013.01); *H01L 21/02211* (2013.01); *H01L 21/02222* (2013.01); *H01L 21/31111* (2013.01); *H01L 21/31138* (2013.01)

(58) Field of Classification Search
None
See application file for complete search history.

(56) References Cited

U.S. PATENT DOCUMENTS

2004/0087176 A1* 5/2004 Colburn ............ H01L 21/76849 438/758
2015/0299848 A1* 10/2015 Haukka .................. C23C 16/06 427/256
2017/0148642 A1* 5/2017 Wang ................ H01L 21/31144
2017/0342553 A1* 11/2017 Yu ....................... H01L 21/3105
2018/0151355 A1* 5/2018 Fukazawa ......... H01L 21/02118
2018/0182618 A1* 6/2018 Blanquart ......... H01L 21/02164
2020/0325573 A1* 10/2020 Illiberi .................... C23C 16/04
2021/0301392 A1* 9/2021 Illiberi ................ C23C 18/1212

* cited by examiner

*Primary Examiner* — Alexander G Ghyka
(74) *Attorney, Agent, or Firm* — Birch, Stewart, Kolasch & Birch, LLP

(57) ABSTRACT

A selective etching process includes treating a first dielectric region and a second dielectric region of a semiconductor device with a self-assembled-monolayer-forming compound to form a self-assembled monolayer to selectively cover the first dielectric region so as to expose the second dielectric region; and selectively etching the second dielectric region using a dilute acid solution while the first dielectric region is protected by the self-assembled monolayer from being etched by the dilute acid solution.

20 Claims, 17 Drawing Sheets

FORMATION OF SELF-ASSEMBLED MONOLAYER FOR SELECTIVE ETCHING PROCESS

REFERENCE TO RELATED APPLICATION

This application claims priority of U.S. Provisional Application No. 63/405,985 filed on Sep. 13, 2022, the contents of which is incorporated herein by reference in its entirety.

BACKGROUND

In a method for manufacturing a semiconductor device, an aqueous solution of phosphoric acid is widely used for selectively etching silicon nitride in a front-end-of-line (FEOL) process. However, the aqueous solution of phosphoric acid cannot be used in a middle-end-of-line (MEOL) process and/or a back-end-of-line (BEOL) process because the aqueous solution of phosphoric acid has an extremely high etching rate on metal, which may cause problems such as metal-gate missing, interconnect metal damage, or the like. In addition, phosphorus residues would be left on the semiconductor device after the etching process, and might degrade the performance of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
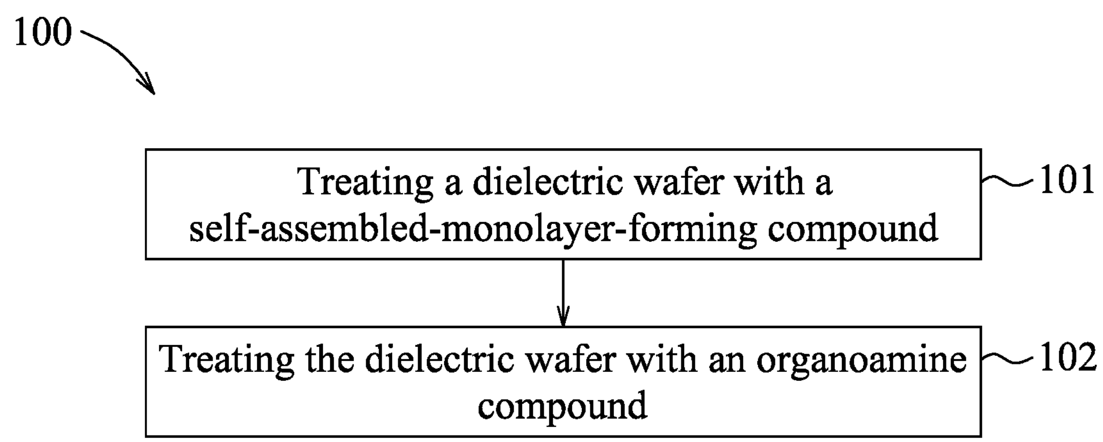
FIG. 1 is a flow diagram illustrating a process for forming a self-assembled monolayer in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “on,” “upper,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
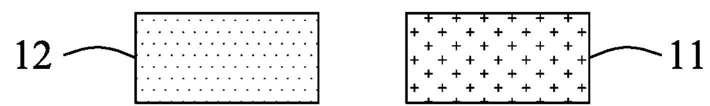
FIGS. 2 to 4 are schematic views illustrating some intermediate stages of the process as depicted in FIG. 1 in accordance with some embodiments.
Figure 3:
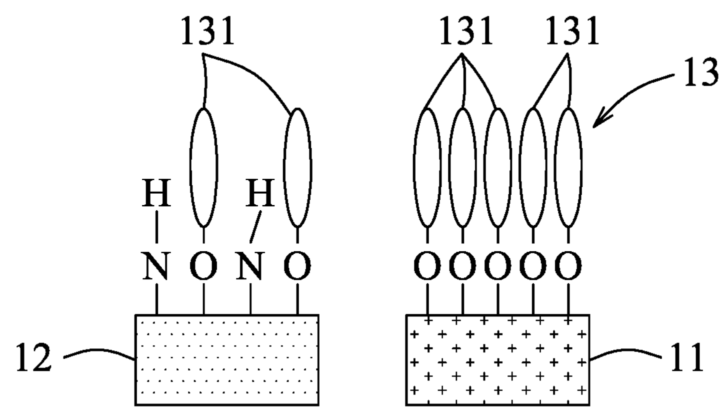
Figure 4:
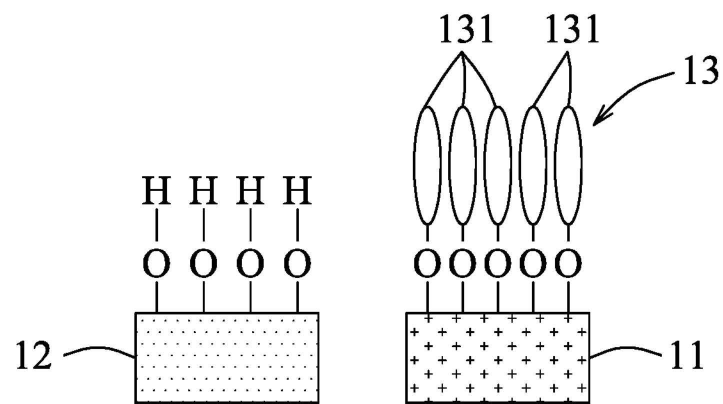

The present disclosure is directed to a selective etching process used in a method for manufacturing a semiconductor device. The selective etching process includes a process for forming a self-assembled monolayer (SAM). FIG. 1 is a flow diagram illustrating a process 100 for forming a SAM in accordance with some embodiments. FIGS. 2 to 4 are schematic views illustrating some intermediate stages of the process as depicted in FIG. 1 in accordance with some embodiments. Additional steps can be provided before, after or during the process 100.

Referring to FIG. 1 and the examples illustrated in FIGS. 2 and 3, the process 100 begins at step 101, where a dielectric wafer is treated with a self-assembled monolayer-forming (SAM-forming) compound. A first dielectric wafer 11 to be treated includes a first dielectric material, and a second dielectric wafer 12 to be treated includes a second dielectric material different from the first dielectric material. In some embodiments, the first dielectric wafer 11 includes, for example, but not limited to, silicon oxide (SiOx), and the second dielectric wafer 12 includes, for example, but not limited to, silicon nitride (SiNx). Other materials suitable for the first and second dielectric wafers 11, 12 are within the contemplated scope of the disclosure. The first dielectric wafer 11 is formed with a plurality of functional groups on a surface thereof. In some embodiments, the functional groups include, for example, but not limited to, hydroxyl groups. In some embodiments, the second dielectric wafer 12 may be formed with a minor amount of the functional groups (for example, but not limited to, the hydroxyl groups) on a surface thereof due to a reaction (for example, but not limited to, an oxidation reaction) occurred on the surface thereof during exposure to an air atmosphere, an ozone plasma treatment, or the like. However, the amount of the functional groups (for example, but not limited to, the hydroxyl groups) formed on the surface of the second dielectric wafer 12 is significantly less than that of the functional groups (for example, but not limited to, the hydroxyl groups) formed on the surface of the first dielectric wafer 11.

Each of the first and second dielectric wafers 11, 12 is treated with a SAM-forming compound. As shown in FIG. 3, a SAM 13 is formed on a surface of the first dielectric wafer 11. The SAM 13 includes a plurality of covalent groups 131 covalently bonded to the surface of the first dielectric wafer 11 through, for example, but not limited to, oxy groups (—O—). The covalent groups 131 are formed by subjecting the functional groups (for example, but not limited to, hydroxyl groups) on the surface of the first dielectric wafer 11 to reaction with the SAM-forming compound. As described above, a minor amount of the functional groups (for example, but not limited to, hydroxyl groups) may be also formed on the surface of the second dielectric wafer 12. Therefore, a minor amount of the covalent groups 131 may be also formed on the surface of the second dielectric wafer 12.

In some embodiments, the SAM-forming compound may include a disilazane compound represented by Formula (I), a silane compound represented by Formula (II), or a combination thereof, (I)

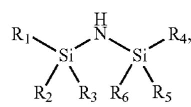

wherein $R_1$, $R_2$, $R_3$, $R_4$, $R_5$, and $R_6$ may be the same as or different from each other, and each of $R_1$, $R_2$, $R_3$, $R_4$, $R_5$, and $R_6$ is independently an alkyl group of $C_nH_{2n+1}$, wherein n is an integer ranging from about 1 to about 5, (II)

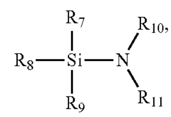

wherein $R_7$, $R_8$, $R_9$, $R_{10}$, and $R_{11}$ may be the same as or different from each other, and each of $R_7$, $R_8$, $R_9$, $R_{10}$, and $R_{11}$ is independently an alkyl group of $C_nH_{2n+1}$, wherein n is an integer ranging from about 1 to about 5. Therefore, in some embodiments, each of the covalent groups 131 covalently bonded to the surface of each of the first and second dielectric wafers 11, 12 shown in FIG. 3 is a trialkylsilyl group represented by Formula (III), (III)

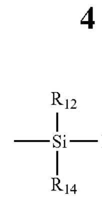

wherein $R_{12}$, $R_{13}$, and $R_{14}$ may be the same as or different from each other, and each of $R_{12}$, $R_{13}$, and $R_{14}$ is independently an alkyl group of $C_nH_{2n+1}$, wherein n is an integer ranging from about 1 to about 5.

Referring to FIG. 1 and the examples illustrated in FIGS. 3 and 4, the process 100 proceeds to step 102, where the dielectric wafer is treated with an organoamine compound. Each of the first and second dielectric wafers 11, 12 treated with the SAM-forming compound is further treated with an organoamine compound. As illustrated in FIG. 3, since the surface of the first dielectric wafer 11 is bonded entirely with the covalent bonds 131 after the treatment with the SAM-forming compound to produce a steric hindrance effect, the covalent bonds 131 formed on the surface of the first dielectric wafer 11 will not be removed by the treatment with the organoamine compound, such that the SAM 13 remains to cover the surface of the first dielectric wafer 11, as illustrated in FIG. 4. Nevertheless, as illustrated in FIG. 3, only a minor amount of the covalent bonds 131 is formed on the surface of the second dielectric wafer 12 after the treatment with the SAM-forming compound, and the covalent bonds 131 formed on the surface of the second dielectric wafer 12 are removed after the treatment with the organoamine compound, as illustrated in FIG. 4, indicating that the SAM 13 is selectively formed on the first dielectric wafer 11.

In some embodiments, the treatment with the organoamine compound may be conducted at a temperature ranging from about 5° C. to about 70° C. In some embodiments, the treatment with the organoamine compound may be conducted for a time period ranging from about 0.1 minute to about 10 minutes. In some embodiments, the organoamine compound may include a tertiary amine represented by Formula (IV), (IV)

$R_{15}$—N($R_{16}$)($R_{17}$)

wherein $R_{15}$, $R_{16}$, and $R_{17}$ may be the same as or different from each other, and each of $R_{15}$, $R_{16}$, and $R_{17}$ is independently an alkyl group of $C_nH_{2n+1}$, wherein n is an integer ranging from about 1 to about 15.

Before the treatment with the SAM-forming compound, when each of the first and second dielectric wafers 11, 12 is evaluated using a contact angle analysis, the contact angle measured on the surface of the first dielectric wafer 11 ranges from about 1° to about 5°, and the contact angle measured on the surface of the second dielectric wafer 12 ranges from about 150 to about 25°. After the treatment with the SAM-forming compound, when each of the first and second dielectric wafers 11, 12 is evaluated using the contact angle analysis, the contact angle measured on the surface of the first dielectric wafer 11 ranges from about 880 to about 89°, and the contact angle measured on the surface of the second dielectric wafer 12 ranges from about 540 to about 56°, which is significantly less than that measured on the surface of the first dielectric wafer 11, indicating that after the treatment with the SAM-forming compound, the amount of the covalent bonds 131 formed on the surface of the second dielectric wafer 12 is significantly less than that of the covalent bonds 131 formed on the surface of the first dielectric wafer 11. After the treatment with the SAM-forming compound and then the treatment with the organoamine compound, when each of the first and second dielectric wafers 11, 12 is evaluated using the contact angle analysis, the contact angle measured on the surface of the first dielectric wafer 11 ranges from about 880 to about 90°, which is substantially the same as that measured on the surface of the first dielectric wafer 11 after the treatment with the SAM-forming compound, indicating that the amount of the covalent bonds 131 formed on the surface of the first dielectric wafer 11 by the treatment with the SAM-forming compound is not decreased by the treatment with the organoamine compound. Nevertheless, the contact angle measured on the surface of the second dielectric wafer 12 ranges from about 150 to about 25°, which is the same as that measured on the surface of the second dielectric wafer 12 before treatment with the SAM-forming compound. These results indicate that the covalent bonds 131 formed on the surface of the second dielectric wafer 12 by the treatment with the SAM-forming compound are removed substantially entirely by the treatment with the organoamine compound.

Figure 5:
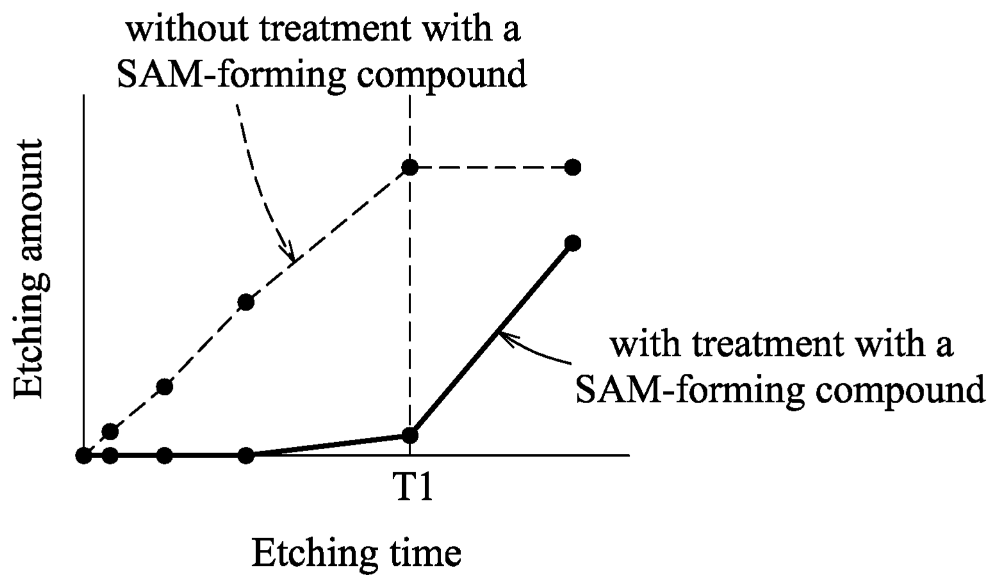
FIG. 5 illustrates a graph showing an etching amount versus an etching time of a first dielectric wafer with a treatment as depicted in FIG. 1 and without the treatment.
Figure 6:
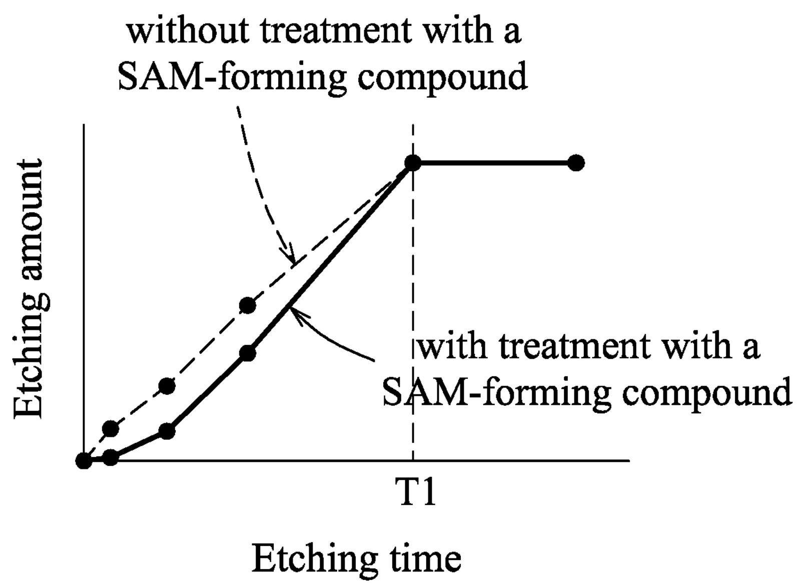
FIG. 6 illustrates a graph showing an etching amount versus an etching time of a second dielectric wafer with a treatment as depicted in FIG. 1 and without the treatment.

Each of the first and second dielectric wafers 11, 12, without the treatment with the SAM-forming compound (i.e., the first and second dielectric wafers 11, 12 illustrated in FIG. 2) and with the treatment with the SAM-forming compound (i.e., the first and second dielectric wafers 11, 12 illustrated in FIG. 3), is evaluated using an etching process. In some embodiments, the etching process is a wet etching process using a dilute aqueous solution of hydrofluoric acid as an etchant. In some embodiments, the dilute aqueous solution of hydrofluoric acid has a hydrofluoric acid concentration ranging from about 0.05% to about 1%. In some embodiments, the etching process is conducted at a temperature ranging from about 5° C. to about 50° C. The result of evaluation of the first dielectric wafer 11 is shown in FIG. 5, and the result of evaluation of the second dielectric wafer 12 is shown in FIG. 6. As shown in FIG. 5, during an etching time period (T1), an etching amount of the first dielectric wafer 11 without the treatment with the SAM-forming compound increases significantly, whereas the first dielectric wafer 11 with the treatment with the SAM-forming compound is not etched substantially. This result indicates that the SAM 13 is formed on the surface of the first dielectric wafer 11 to protect the first dielectric wafer 11 from being etched by the etchant (see FIG. 3). As shown in FIG. 6, during the etching time period (T1), an etching amount of the second dielectric wafer 12 without the treatment with the SAM-forming compound increases significantly, and the etching amount of the second dielectric wafer 12 with the treatment with the SAM-forming compound also increases and is substantially the same as that of the second dielectric wafer 12 without the treatment with the SAM-forming compound. This result indicates that only a minor amount of the covalent bonds 131 is formed on the surface of the second dielectric wafer 12 (see FIG. 3), such that the minor amount of the covalent bonds 131 cannot be formed into an SAM to protect the second dielectric wafer 12 from being etched by the etchant.

Figure 7:
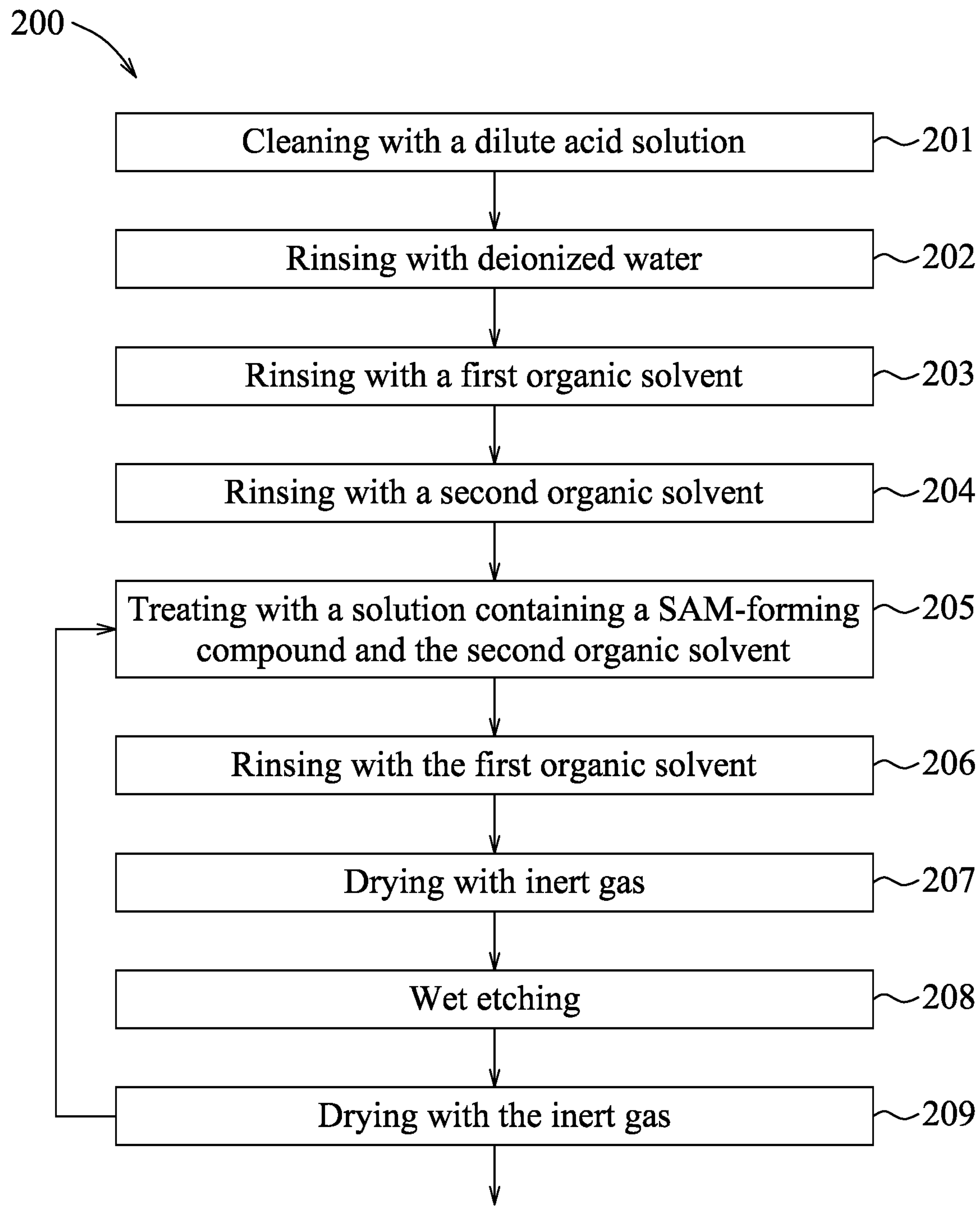
FIG. 7 is a flow diagram illustrating an etching process including the process for forming a self-assembled monolayer in accordance with some embodiments.

FIG. 7 is a flow diagram illustrating a process 200 in which each of the first and second dielectric wafers 11, 12 is subjected to a pretreatment process and then a cyclic treatment process. Additional steps can be provided before, after or during the process 200. The pretreatment process begins at step 201, in which each of the first and second dielectric wafers 11, 12 is cleaned with a dilute acid solution to remove contaminants from the surface thereof. In some embodiments, the dilute acid solution may be, for example, but not limited to, a dilute aqueous solution of hydrofluoric acid. The process 200 then proceeds to step 202, in which each of the first and second dielectric wafers 11, 12 is rinsed with deionized water to clean the dilute acid solution from the surface thereof. Thereafter, the process 200 proceeds to step 203, in which each of the first and second dielectric wafers 11, 12 is rinsed with a first organic solvent to clean the deionized water from the surface thereof. In some embodiments, the first organic solvent may be, for example, but not limited to, isopropyl alcohol. The process 200 then proceeds to step 204, in which each of the first and second dielectric wafers 11, 12 is rinsed with a second organic solvent, which is a solvent used for preparing a solution containing the SAM-forming compound, and which is used to replace the first organic solvent on the surface of each of the first and second dielectric wafers 11, 12 with the second organic solvent. In some embodiments, the second organic solvent may include, for example, but not limited to, propylene glycol monomethylether acetate (PGMEA), acetone, benzene, ethyl ether, heptane, perchloroethylene, ethylene dimethanesulfonate (DMSE), ethyl acetate, or the like, or combinations thereof.

The process 200 then proceeds to the cyclic treatment process. Each cycle of the cyclic treatment process begins at step 205, in which each of the first and second dielectric wafers 11, 12 is treated with a solution containing the SAM-forming compound and the second organic solvent. In some embodiments, the SAM-forming compound is present in the solution at a concentration ranging from about 0.5% to about 9%. In some embodiments, the treatment with the solution containing the SAM-forming compound and the second organic solvent is conducted at a temperature ranging from about 5° C. to about 70° C. for a time period ranging from about 0.1 minute to about 10 minutes. In step 205, as illustrated in FIG. 3, the SAM 13 is formed on the surface of the first dielectric wafer 11, and nevertheless, only a minor amount of the covalent groups 131 may be formed on the surface of the second dielectric wafer 12. Each cycle of the cyclic treatment process then proceeds to step 206, in which each of the first and second dielectric wafers 11, 12 is rinsed with the first organic solvent to remove from the surface thereof the remainder of the SAM-forming compound which is not reacted to form the covalent groups 131. Each cycle of the cyclic treatment process then proceeds to step 207, in which each of the first and second dielectric wafers 11, 12 is dried with inert gas. In some embodiments, the inert gas includes nitrogen gas. Thereafter, each cycle of the cyclic treatment process proceeds to step 208, in which each of the first and second dielectric wafers 11, 12 is subjected to a wet etching process. In some embodiments, the wet etching process is conducted using a dilute acid solution (for example, but not limited to, a dilute aqueous solution of hydrofluoric acid) as an etchant. In some embodiments, the dilute aqueous solution of hydrofluoric acid has a hydrofluoric acid concentration ranging from about 0.05% to about 1%. In some embodiments, the wet etching is conducted at a temperature ranging from about 5° C. to about 50° C. for a time period ranging from 0.1 minute to about 10 minutes. Each cycle of the cyclic treatment process then proceeds to step 209, in which each of the first and second dielectric wafers 11, 12 is dried with the inert gas.

Figure 8:
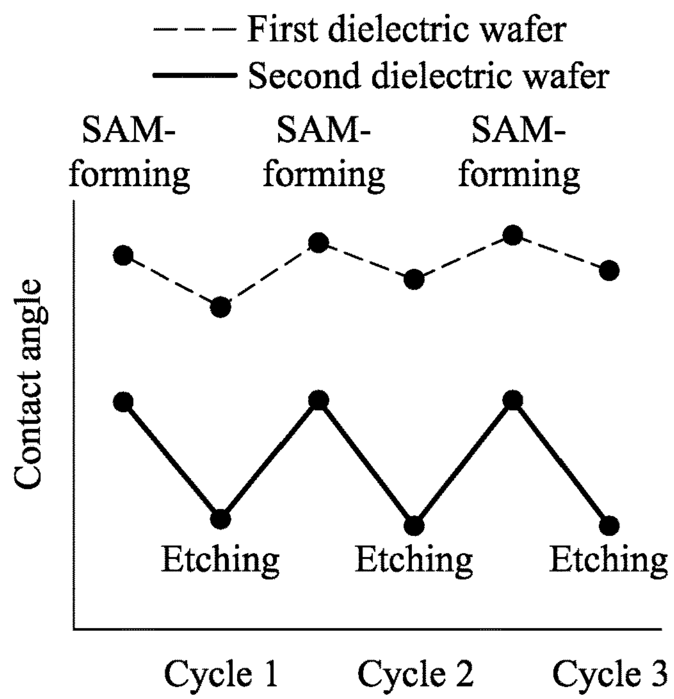
FIG. 8 illustrates a graph showing contact angle variation of each of the first and second dielectric wafers during the etching process.

In each cycle of the cyclic treatment process, the contact angle on the surface of each of the first and second dielectric wafers 11, 12 after the treatment with the solution containing the SAM-forming compound and after the wet etching process is measured using the contact angle analysis, and results are shown in FIG. 8. In addition, a total etching amount of each of the first and second dielectric wafers 11, 12 after each cycle of the cyclic treatment process is measured, and the results are shown in FIG. 9.

Referring to FIG. 8, after the treatment with the solution containing the SAM-forming compound in each cycle of the cyclic treatment process, the contact angle measured on the surface of the first dielectric wafer 11 is significantly greater than that measured on the surface of the second dielectric wafer 12. This result indicates that after the treatment with the SAM-forming compound, the amount of the covalent bonds 131 formed on the surface of the first dielectric wafer 11 is significantly greater than that of the covalent bonds 131 formed on the surface of the second dielectric wafer 12, and that the SAM 13 is formed on the surface of the first dielectric wafer 11. In addition, after the wet etching process in each cycle of the cyclic treatment process, the contact angle measured on the surface of the first dielectric wafer 11 is decreased by a value which is significantly less than a decreased value of the contact angle measured on the surface of the second dielectric wafer 12. This result indicates that after the wet etching process, the amount of the covalent bonds 131 formed on the surface of the first dielectric wafer 11 is maintained substantially the same as the amount before the wet etching process. In other words, the SAM 13 still covers the surface of the first dielectric wafer 11 after the wet etching process.

Figure 9:
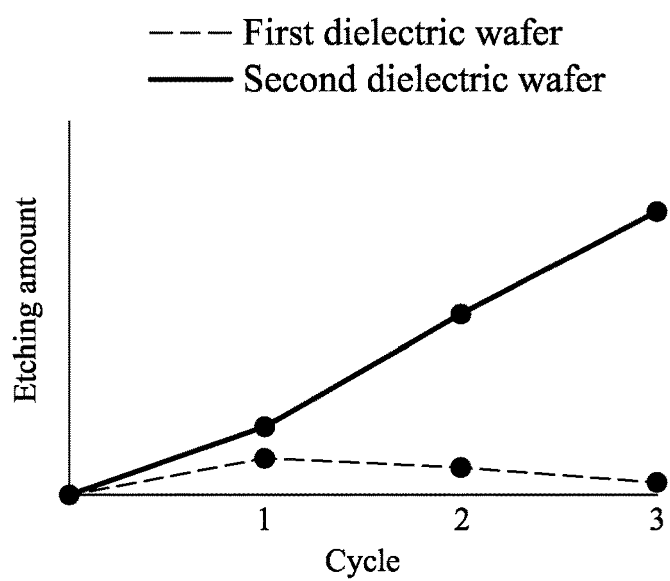
FIG. 9 illustrates a graph showing etching amount variation of each of the first and second dielectric wafers during the etching process.

Referring to FIG. 9, the total etching amount of the second dielectric wafer 12 increases with the increase in the cycle number of the cyclic treatment process, while the first dielectric wafer 11 is substantially not etched by the wet etching process that is conducted with the increase in the cycle number of the cyclic treatment process. This result indicates that the SAM 13 is formed on the surface of the first dielectric wafer 11 to protect the first dielectric wafer 11 from being etched by the wet etching process.

The selective etching method of the present disclosure described above may be applied in a front-end-of-line (FEOL) process, a middle-end-of-line (MEOL) process, and/or a back-end-of-line (BEOL) process in a method for manufacturing a semiconductor device.

Figure 10:
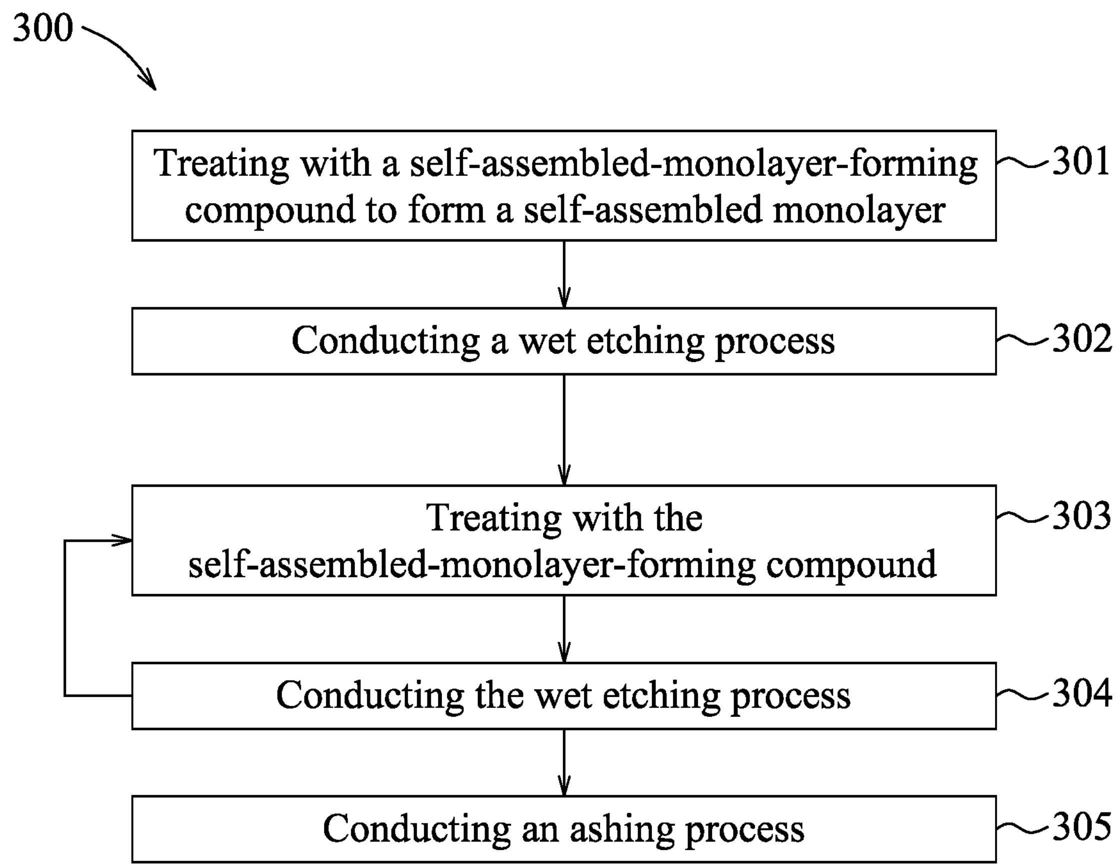
FIG. 10 is a flow diagram illustrating a process for selectively removing a pad layer, which includes the process for forming a self-assembled monolayer in accordance with some embodiments, in a front-end-of-line process of a method for manufacturing a semiconductor device.

FIG. 10 is a flow diagram illustrating a method 300 for removing a pad layer formed on a semiconductor device in the FEOL process using the selective etching method of the present disclosure. FIGS. 11 to 16 are schematic views illustrating some intermediate stages of the method 300 as depicted in FIG. 10 in accordance with some embodiments. Additional steps can be provided before, after or during the method 300, and some of the steps described herein may be replaced by other steps or be eliminated.

Figure 11:
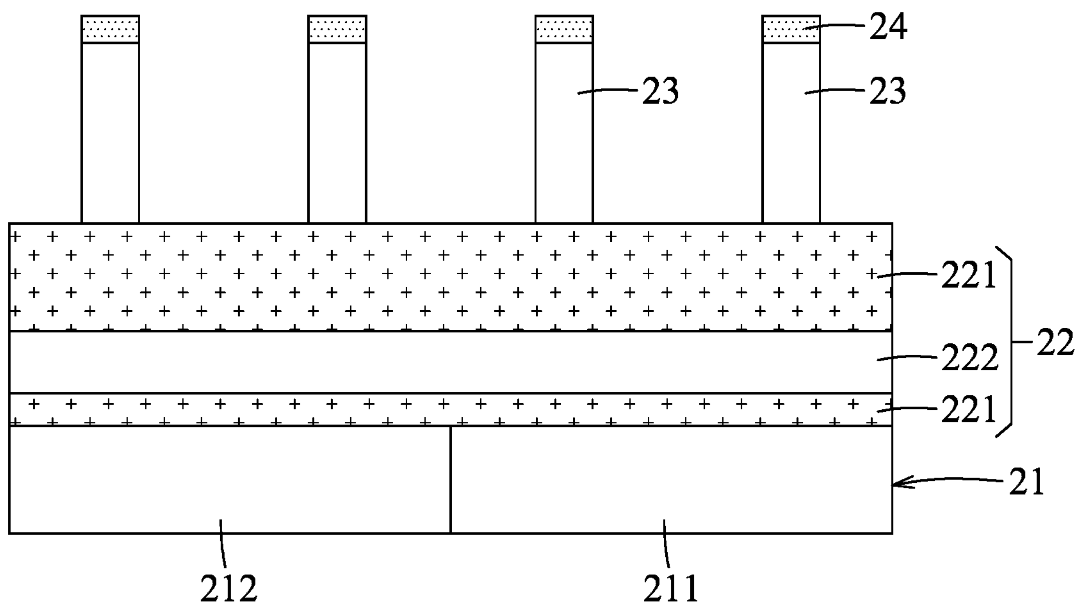
FIGS. 11 to 16 are schematic views illustrating some intermediate stages of the process as depicted in FIG. 10 in accordance with some embodiments.
Figure 12:
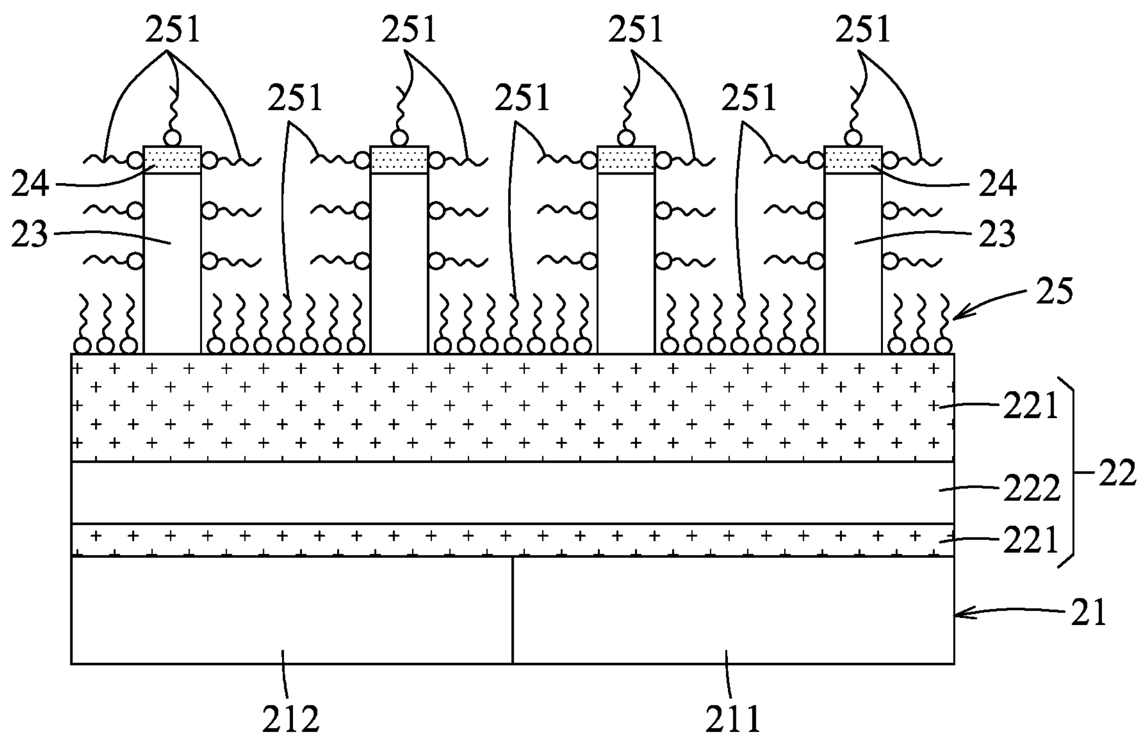

Referring to FIG. 10 and the examples illustrated in FIGS. 11 and 12, the method 300 begins at step 301, where a semiconductor device is treated with the SAM-forming compound to form the SAM. A semiconductor device illustrated in FIG. 11 includes a substrate 21, a multi-layer dielectric stack 22 disposed on the substrate 21, a plurality of fin structures 23 disposed on the multi-layer dielectric stack 22 and spaced apart from each other, and a pad layer 24 disposed on the fin structures 23.

In some embodiments, the substrate 21 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. In some embodiments, the substrate 21 is formed with an N-type region 211 and a P-type region 212. The N-type region 211 includes a first semiconductor material, and the P-type region 212 includes a second semiconductor material different from the first semiconductor material. In some embodiments, one of the N-type region 211 and the P-type region 212 includes silicon (Si), and the other one of the N-type region 211 and the P-type region 212 includes silicon germanium (SiGe).

The multi-layer dielectric stack 22 includes at least one first dielectric layer 221 and at least one second dielectric layer 222. In some embodiments, the multi-layer dielectric stack 22 includes two first dielectric layers 221 and one second dielectric layer 222 interposed between the two first dielectric layers 221, as illustrated in FIG. 11. In some embodiments, the multi-layer dielectric stack 22 may include a plurality of the first dielectric layers 221 and a plurality of the second dielectric layers 222, which are alternately stacked on the substrate 21. In some embodiments, the first dielectric layer 221 may include a first dielectric material, and the second dielectric layer 222 may include a second dielectric material different from the first dielectric material. In some embodiments, the first dielectric layer 221 may include, for example, but not limited to, silicon oxide (SiOx), and the second dielectric layer 222 may include, for example, but not limited to, silicon nitride (SiNx). In some embodiments, the uppermost layer of the multi-layer dielectric stack 20 is the first dielectric layer 221, which includes silicon oxide.

The fin structures 23 are disposed on the multi-layer dielectric stack 22 and are spaced apart from each other. In some embodiments, the fin structures 23 may include a semiconductor material (for example, but not limited to, silicon (Si)).

The pad layer 24 disposed on the fin structures 23 includes a dielectric material different from that for forming the uppermost layer of the multi-layer dielectric stack 22. In some embodiments, the uppermost layer of the multi-layer dielectric stack 22 includes, for example, but not limited to, silicon oxide, and the pad layer 24 includes, for example, but not limited to, silicon nitride.

The semiconductor device is treated with a self-assembled-monolayer-forming (SAM-forming) compound to form a self-assembled monolayer (SAM) 25 on the uppermost layer of the multi-layer dielectric stack 22. The SAM 25 includes a plurality of covalent groups 251 covalently bonded to the surface of the uppermost layer of the multi-layer dielectric stack 22. The formation of the SAM 25 is the same as or similar to that of the SAM layer 13 described above with reference to FIGS. 2 and 3, and thus details thereof are omitted for the sake of brevity. A minor amount of the covalent groups 251 may be also formed on the surface of the fin structures 23 and the surface of the pad layer 24.

Figure 13:
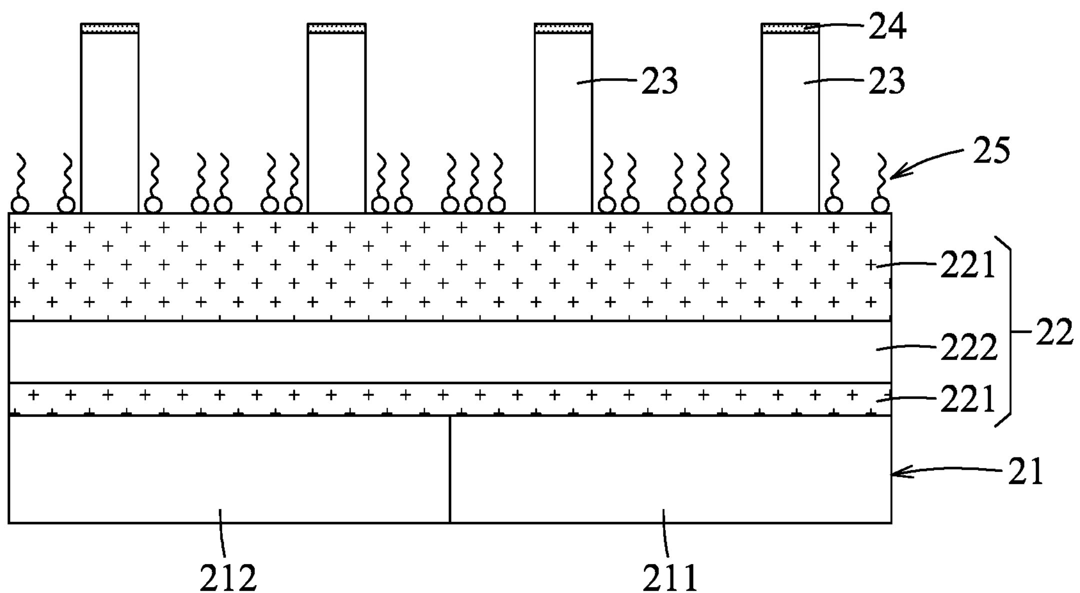

Referring to FIG. 10 and the examples illustrated in FIGS. 12 and 13, the method 300 proceeds to step 302, where a wet etching process is conducted. The wet etching process using a dilute acid solution (for example, but not limited to, a dilute aqueous solution of hydrofluoric acid) as an etchant as described above is conducted to remove a portion of the pad layer 24. Since the uppermost layer of the multi-layer dielectric stack 22 is covered with the SAM 25, the uppermost layer of the multi-layer dielectric stack 22 can be protected from being etched away by the etchant during the wet etching process.

Figure 14:
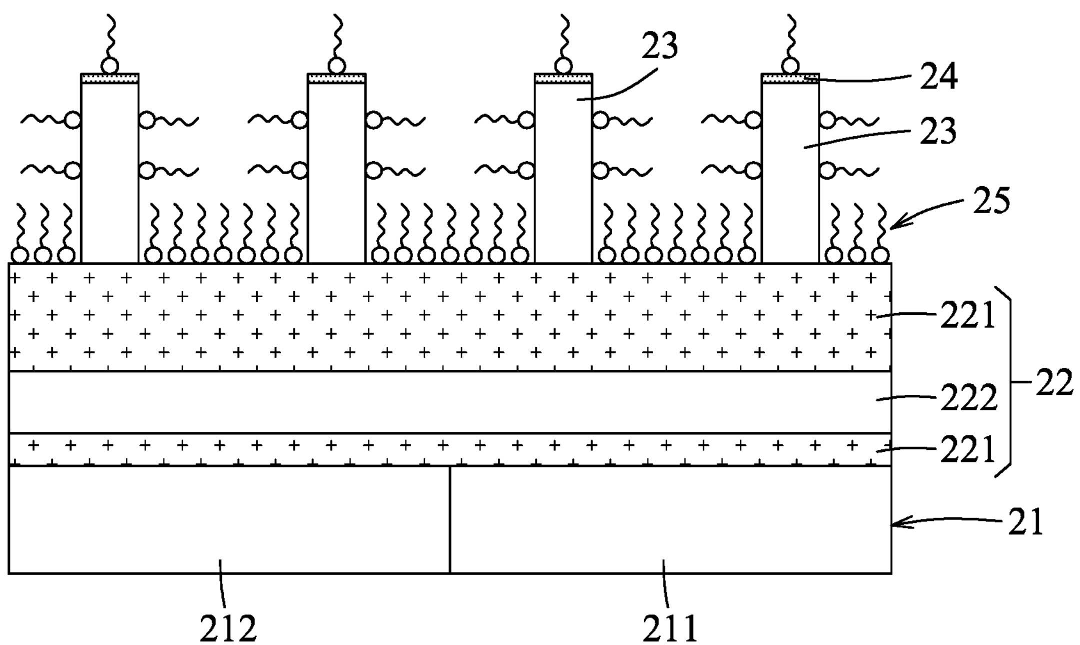

Referring to FIG. 10 and the examples illustrated in FIGS. 13 and 14, the method 300 proceeds to step 303, the semiconductor device is treated with the SAM-forming compound again. As shown in FIGS. 12 and 13, the covalent groups 251 bonded to the surfaces of the pad layer 24 and the fin structures 23 and a minor amount of the covalent groups 251 bonded to the surface of the uppermost layer of the multi-layer dielectric stack 22 may be removed during the wet etching process. Therefore, the semiconductor device is treated with the SAM-forming compound again so as to ensure that the uppermost layer of the multi-layer dielectric stack 22 is entirely covered with the SAM 25. Step 303 is conducted in a manner the same as that of step 301, and thus details thereof are omitted for the sake of brevity.

Referring to FIG. 10, the method 300 proceeds to step 304, where the wet etching process is conducted again. The wet etching process is conducted again in a manner the same as that of step 302 to further remove a portion of the pad layer 24, and details thereof are omitted for the sake of brevity.

Figure 15:
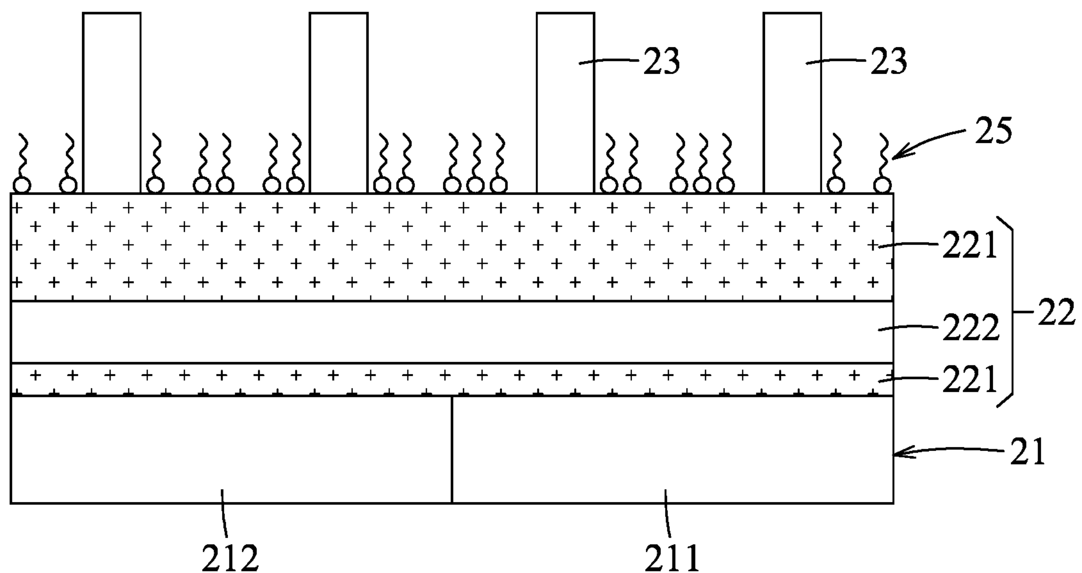

Referring to the example illustrated in FIG. 15, thereafter, steps 303 and 304 are repeated until the pad layer 40 shown in FIGS. 13 and 14 is removed completely.

Figure 16:
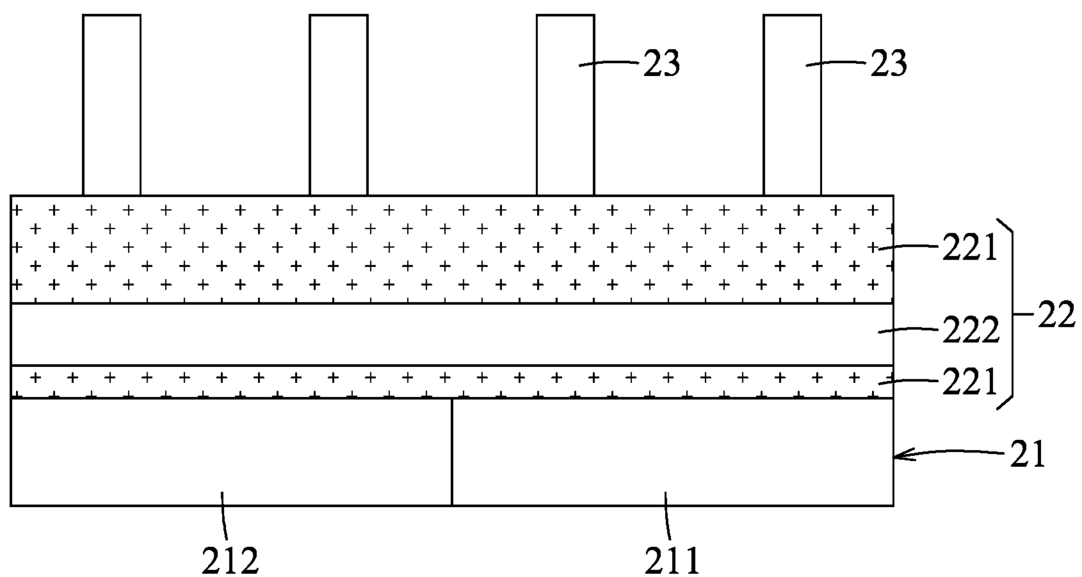

Referring to FIG. 10 and the examples illustrated in FIGS. 15 and 16, the method 300 proceeds to step 305, where an ashing process is conducted. The SAM 25 remaining on the uppermost layer of the multi-layer dielectric stack 22 is removed by an ashing process. In some embodiments, the ashing process is conducted using an $N_2/H_2$ plasma. In some embodiments, the ashing process is conducted at a temperature ranging from about 100° C. to about 200° C. In some embodiments, a gas source for forming the $N_2/H_2$ plasma includes, for example, but not limited to, about 1-10% of hydrogen gas and about 90-99% of nitrogen gas. In some embodiments, the ashing process is conducted at a pressure ranging from about 50 mTorr to about 1000 mTorr. In some embodiments, the ashing process is conducted at a power ranging from about 1000 W to about 5000 W.

Figure 17:
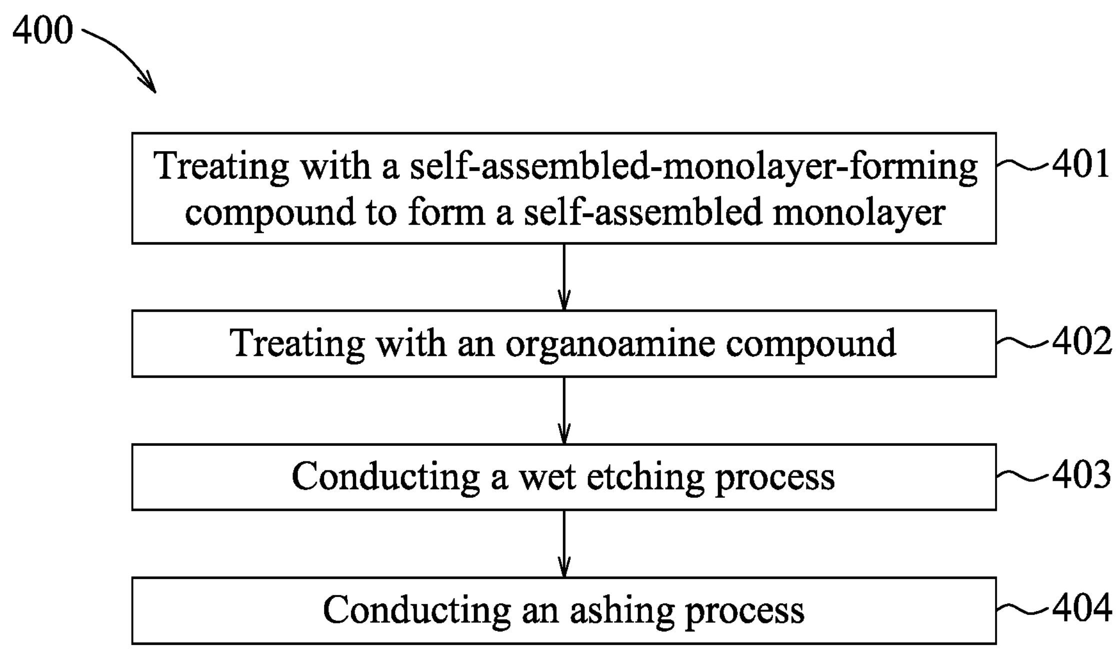
FIG. 17 is a flow diagram illustrating a process for selectively removing a hard mask layer, which includes the process for forming a self-assembled monolayer in accordance with some embodiments, in a front-end-of-line process of a method for manufacturing a semiconductor device.

FIG. 17 is a flow diagram illustrating a method 400 for removing a hard mask formed on a semiconductor device in the FEOL process using the selective etching method of the present disclosure. FIGS. 18 to 22 are schematic views illustrating some intermediate stages of the method 400 as depicted in FIG. 17 in accordance with some embodiments. Additional steps can be provided before, after or during the method 400, and some of the steps described herein may be replaced by other steps or be eliminated.

Figure 18:
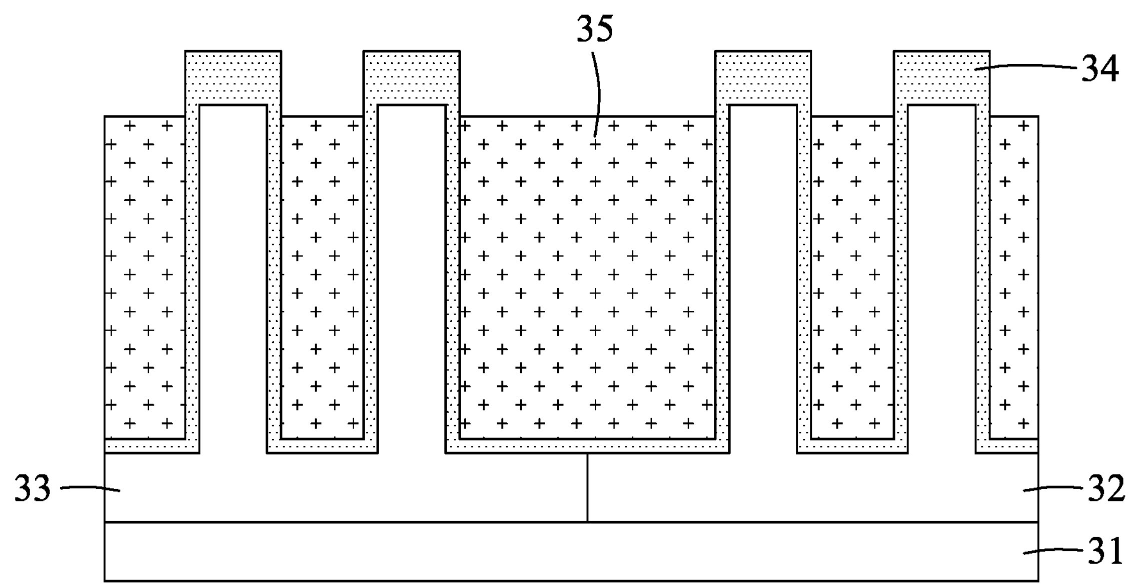
FIGS. 18 to 22 are schematic views illustrating some intermediate stages of the process as depicted in FIG. 17 in accordance with some embodiments.
Figure 19:
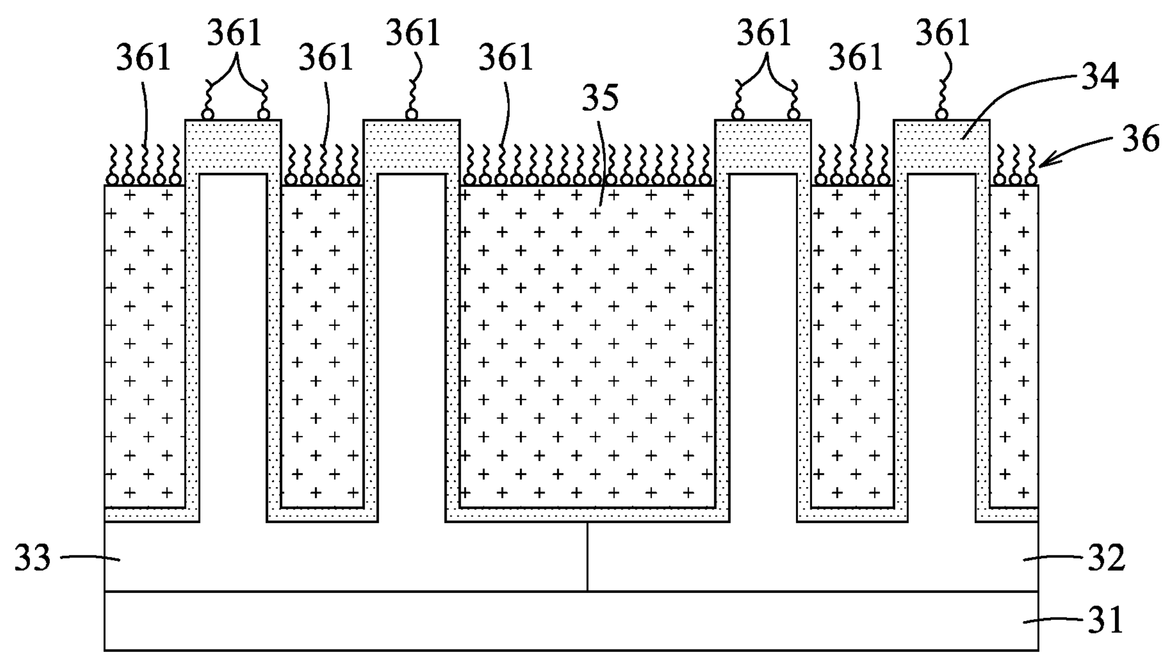

Referring to FIG. 17 and the examples illustrated in FIGS. 18 and 19, the method 400 begins at step 401, where a semiconductor device is treated with a self-assembled-monolayer-forming (SAM-forming) compound to form a self-assembled layer (SAM). A semiconductor device illustrated in FIG. 18 includes a substrate 31, a first transistor 32 and a second transistor 33 formed on the substrate 31, a hard mask layer 34 conformally deposited on the first and second transistors 32, 33, and a dielectric layer 35 disposed on the hard mask layer 34 to expose portions of the hard mask layer 34. In some embodiments, the substrate 31 may be the same as or similar to the substrate 21 described above with reference to FIG. 11, and thus details thereof are omitted for the sake of brevity. In some embodiments, one of the first and second transistors 32, 33 may be a PMOS (P-type metal oxide semiconductor) transistor, and the other one of the first and second transistors 32, 33 may be an NMOS (N-type metal oxide semiconductor) transistor. The hard mask layer 34 includes a first dielectric material, and the dielectric layer 35 includes a second dielectric material different from the first dielectric material. In some embodiments, the hard mask layer 34 includes silicon nitride, and the dielectric layer 35 includes silicon oxide.

The semiconductor device is treated with a self-assembled-monolayer-forming (SAM-forming) compound to form a self-assembled monolayer (SAM) 36 on the dielectric layer 35. The SAM 36 includes a plurality of covalent groups 361 covalently bonded to the surface of the dielectric layer 35. The formation of the SAM 36 is the same as or similar to that of the SAM layer 13 described above with reference to FIGS. 2 and 3, and thus details thereof are omitted for the sake of brevity. A minor amount of the covalent groups 361 may be also formed on the surface of the portion of the hard mask layer 34 exposed from the dielectric layer 35.

Figure 20:
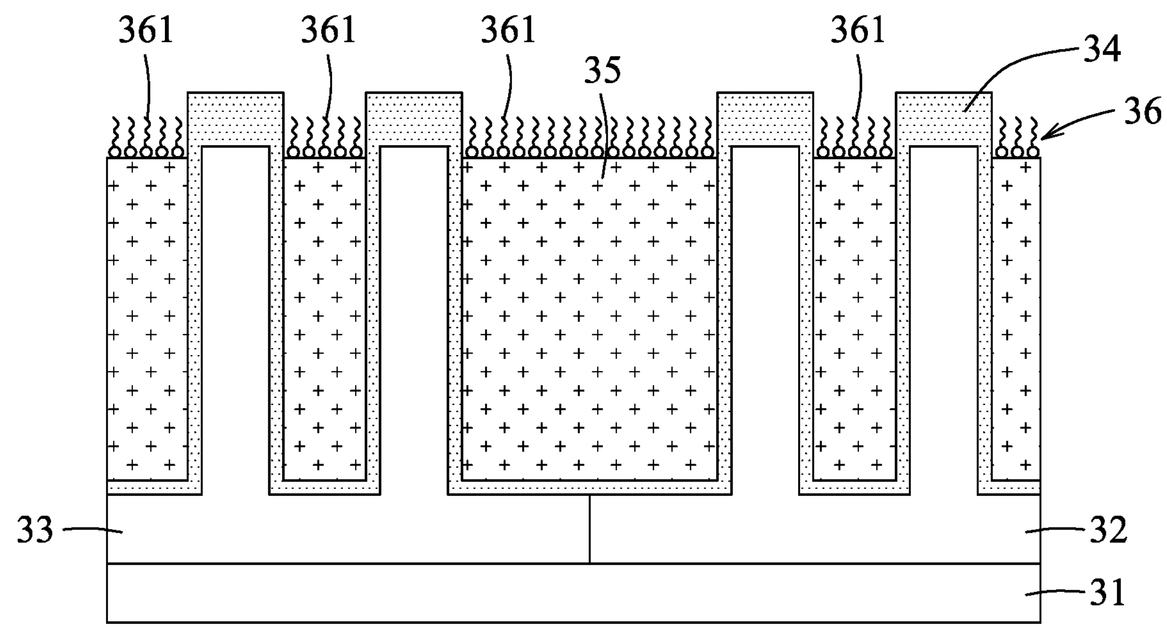

Referring to FIG. 17 and the examples illustrated in FIGS. 19 and 20, the method 400 proceeds to step 402, where the semiconductor device is treated with an organoamine compound. The semiconductor device is treated with an organoamine compound to remove the covalent groups 361 formed on the surface of the portion of the hard mask layer 34 exposed from the dielectric layer 35. The treatment with the organoamine compound is the same as or similar to that described with reference to FIGS. 3 and 4, and thus details thereof are omitted for the sake of brevity.

Figure 21:
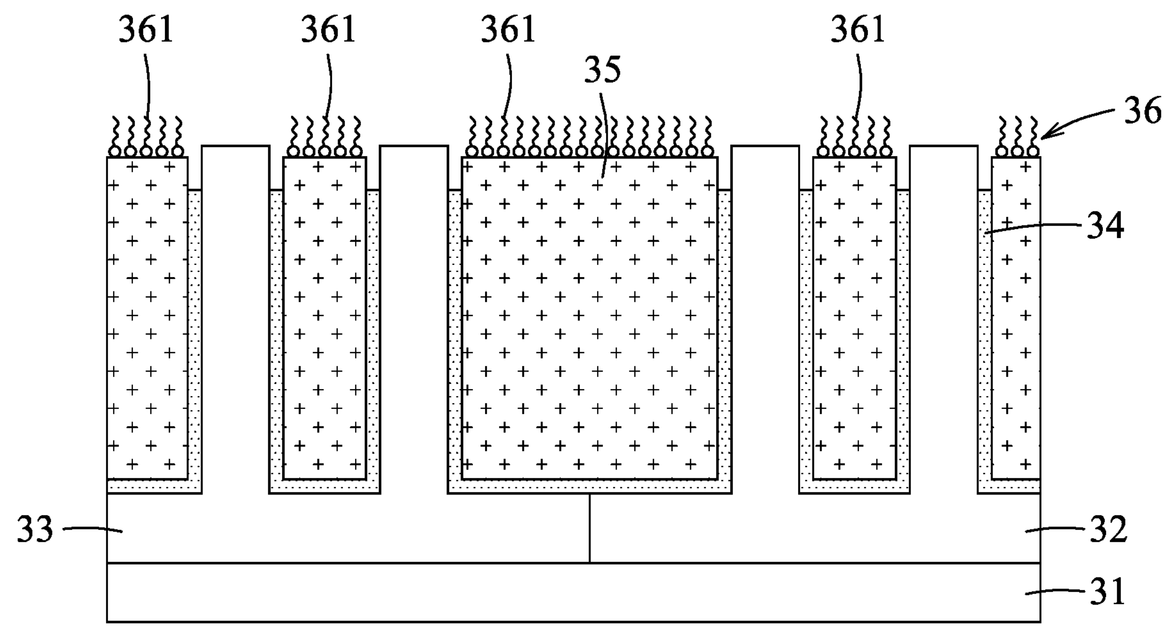

Referring to FIG. 17 and the examples illustrated in FIGS. 20 and 21, the method 400 proceeds to step 403, where a wet etching process is conducted. The wet etching process using the aforesaid dilute acid solution (for example, but not limited tom, the dilute aqueous solution of hydrofluoric acid) as an etchant is conducted to remove upper portions of the hard mask layer 34 so as to expose the first and second transistors 32, 33. Since the dielectric layer 35 is covered with the SAM 36, the dielectric layer 35 can be protected from being etched away during the wet etching process.

Figure 22:
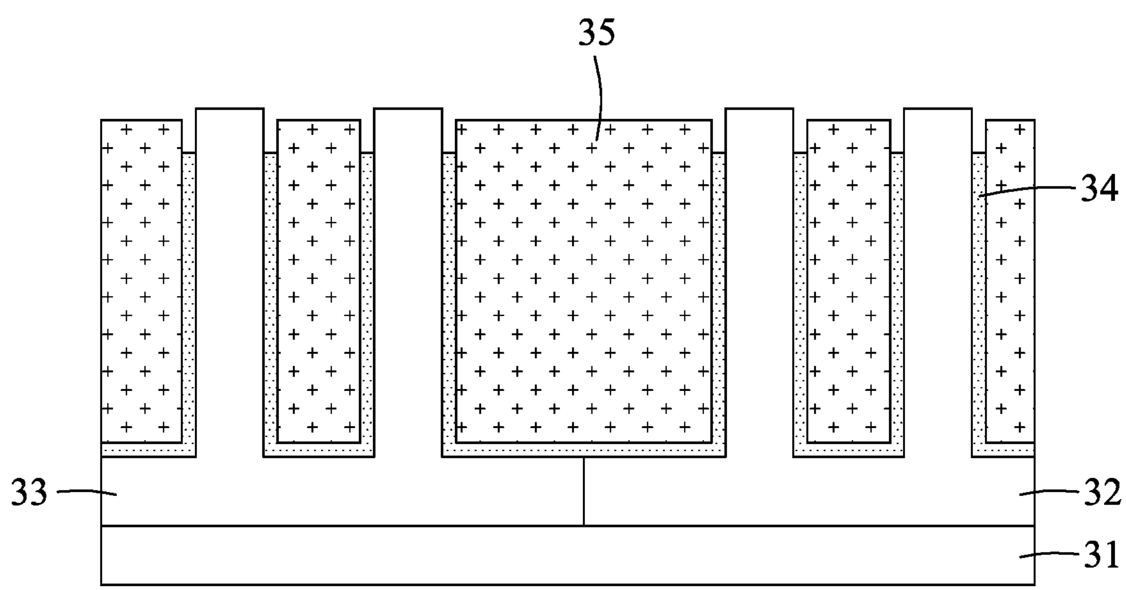

Referring to FIG. 17 and the examples illustrated in FIGS. 21 and 22, the method 400 proceeds to step 404, where an ashing process is conducted. The SAM 36 remaining on the dielectric layer 35 is removed by an ashing process. In some embodiments, the ashing process may be conducted in a manner the same as or similar to that described above with reference to FIGS. 15 and 16, and thus details thereof are omitted for the sake of brevity.

Figure 23:
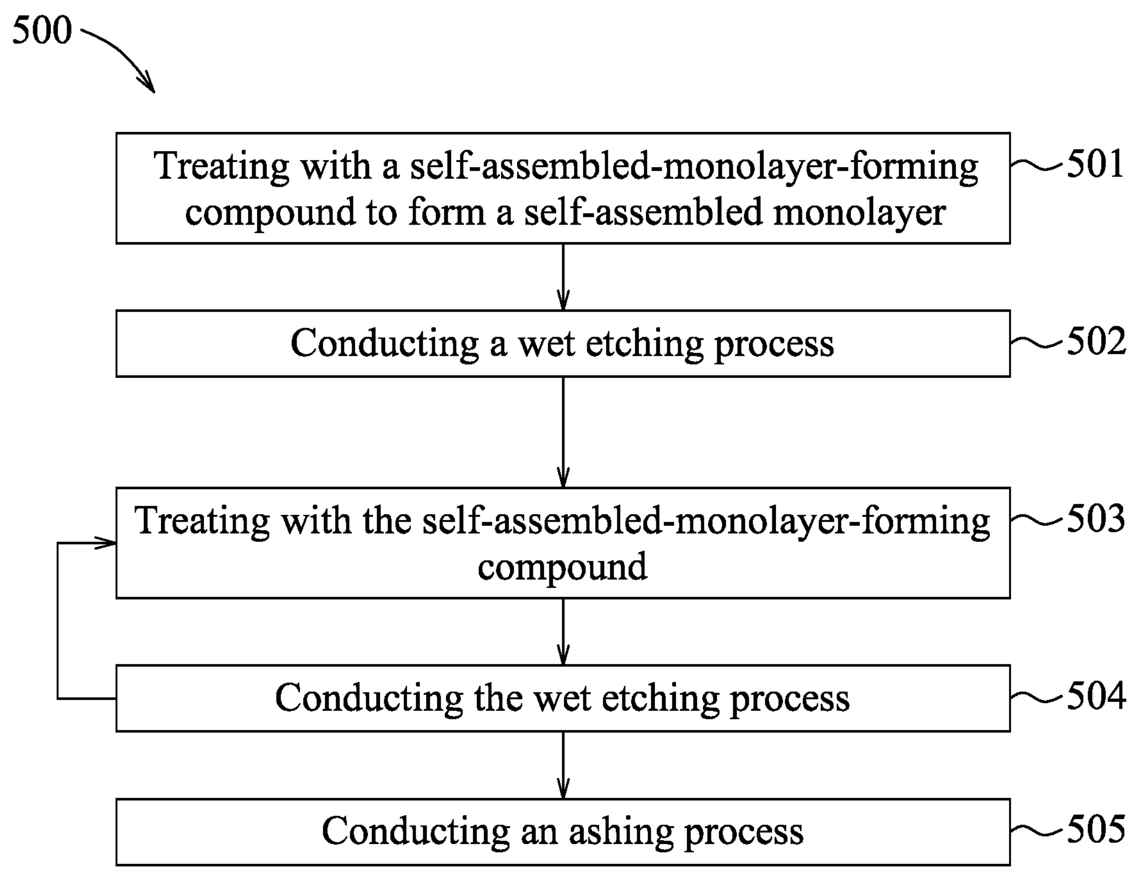
FIG. 23 is a flow diagram illustrating a process for patterning a dielectric layer by a selective etching procedure, which includes the process for forming a self-assembled monolayer in accordance with some embodiments, in a back-end-of-line process of a method for manufacturing a semiconductor device.

FIG. 23 is a flow diagram illustrating a method 500 for patterning a dielectric layer of a semiconductor device in the BEOL process using the selective etching method of the present disclosure. FIGS. 24 to 29 are schematic views illustrating some intermediate stages of the method 500 as depicted in FIG. 23 in accordance with some embodiments. Additional steps can be provided before, after or during the method 500, and some of the steps described herein may be replaced by other steps or be eliminated.

Figure 24:
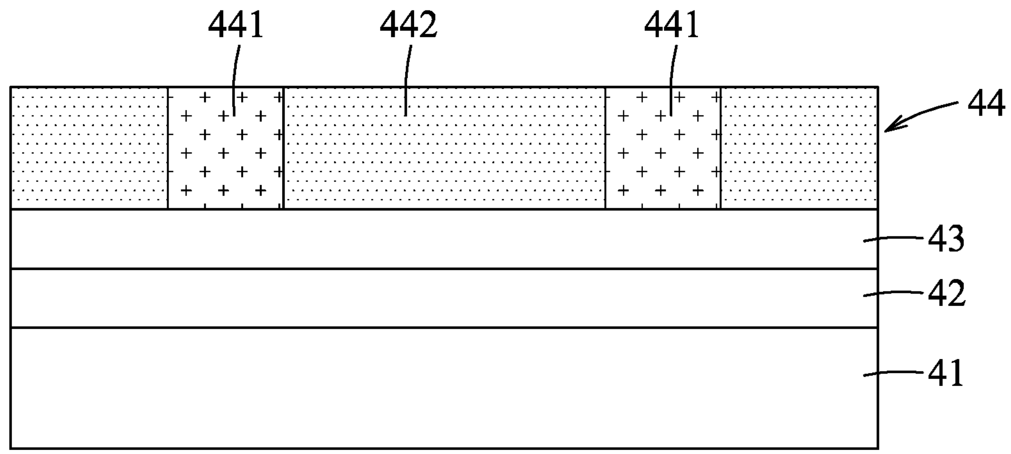
FIGS. 24 to 29 are schematic views illustrating some intermediate stages of the process as depicted in FIG. 23 in accordance with some embodiments.
Figure 25:
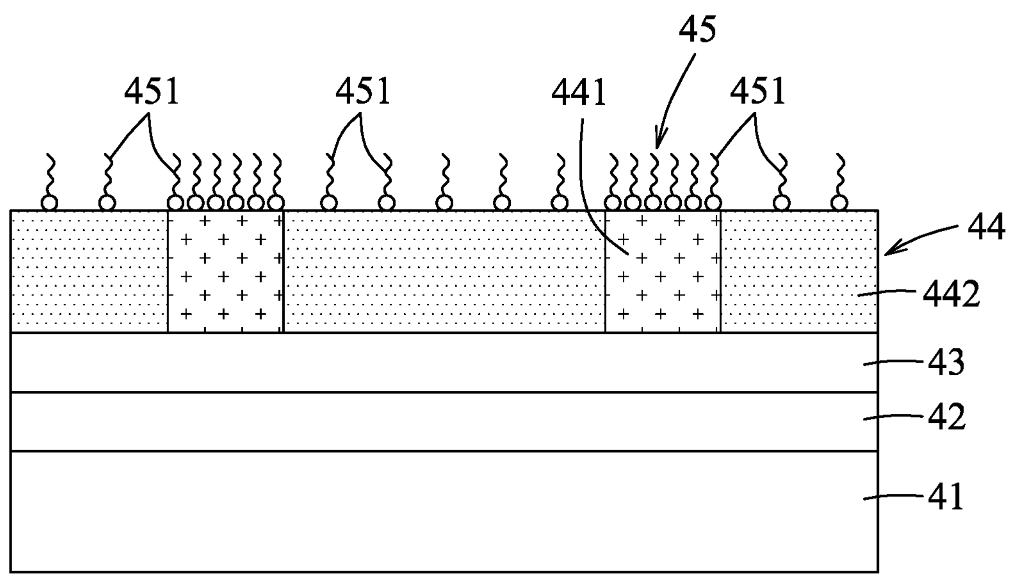

Referring to FIG. 23 and the examples illustrated in FIGS. 24 and 25, the method 500 begins at step 501, where a semiconductor device is treated with a self-assembled-monolayer-forming (SAM-forming) compound to form a self-assembled layer (SAM). A semiconductor device illustrated in FIG. 24 includes a substrate 41, a first epitaxial layer 42 disposed on the substrate 41, a second epitaxial layer 43 disposed on the first epitaxial layer 42, and a dielectric layer 44 disposed on the second epitaxial layer 43. In some embodiments, the substrate 41 may be the same as or similar to the substrate 21 described above with reference to FIG. 11, and thus details thereof are omitted for the sake of brevity. In some embodiments, the first epitaxial layer 42 is, for example, but not limited to, a doped silicon epitaxial layer. In some embodiments, the second epitaxial layer 43 is, for example, but not limited to, an undoped silicon epitaxial layer. The dielectric layer 44 includes a first dielectric region 441 and a second dielectric region 442. The first dielectric region 441 includes a first dielectric material, and the second dielectric region 442 includes a second dielectric material different from the first dielectric material. In some embodiments, the first dielectric region 441 includes silicon oxide, and the second dielectric region 442 includes silicon nitride.

The semiconductor device is treated with a self-assembled-monolayer-forming (SAM-forming) compound to form a self-assembled monolayer (SAM) 45 on the first dielectric region 441 of the dielectric layer 44. The SAM 45 includes a plurality of covalent groups 451 covalently bonded to the surface of the first dielectric region 441 of the dielectric layer 44. The formation of the SAM 45 is the same as or similar to that of the SAM layer 13 described above with reference to FIGS. 2 and 3, and thus details thereof are omitted for the sake of brevity. A minor amount of the covalent groups 451 may be also formed on the surface of the second dielectric region 442 of the dielectric layer 44, as illustrated in FIG. 25.

Figure 26:
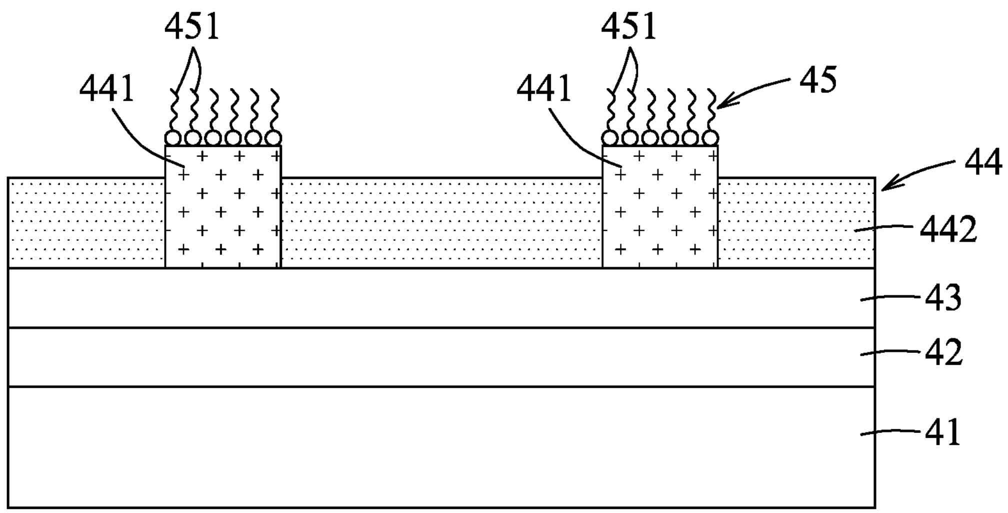

Referring to FIG. 23 and the examples illustrated in FIGS. 25 and 26, the method 500 proceeds to step 502, where a wet etching process is conducted. The wet etching process using the aforesaid dilute acid solution (for example, but not limited to, the dilute aqueous solution of hydrofluoric acid) as an etchant is conducted to remove a portion of the second dielectric region 442. Since the first dielectric region 441 is covered with the SAM 45, the first dielectric region 441 can be protected from being etched away by the etchant during the wet etching process.

Figure 27:
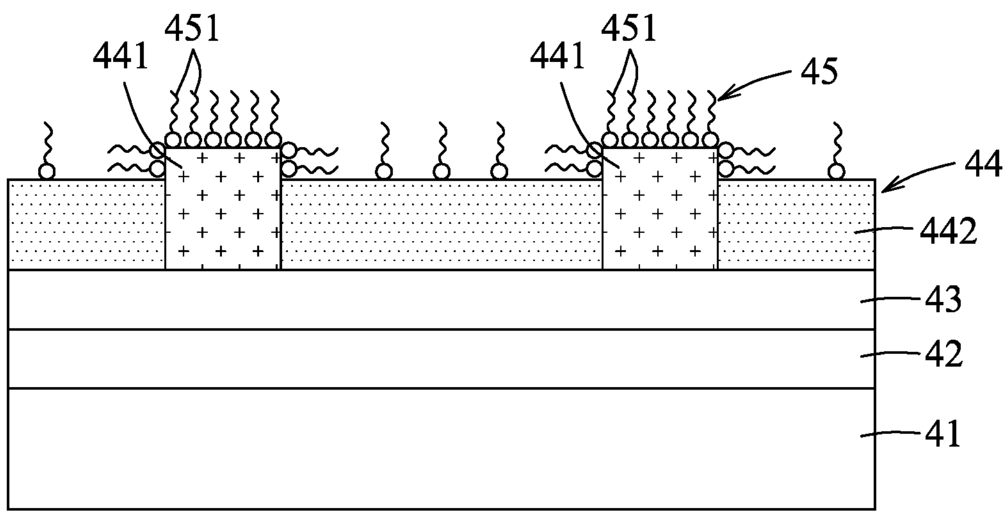

Referring to FIG. 23 and the examples illustrated in FIGS. 26 and 27, the method 500 proceeds to step 503, where the semiconductor device is treated with the SAM-forming compound again. As shown in FIGS. 25 and 26, the covalent groups 451 bonded to the surfaces of the second dielectric region 442 and a minor amount of the covalent groups 451 bonded to the surfaces of the first dielectric region 441 may be removed during the wet etching process. Therefore, the semiconductor device is treated with the SAM-forming compound again so as to ensure the first dielectric region 441 is entirely covered with the SAM 45. Step 503 is conducted in a manner the same as that of step 501, and thus details thereof are omitted for the sake of brevity.

Referring to FIG. 23, the method 500 proceeds to step 504, where the wet etching process is conducted again. The wet etching process is conducted again in a manner the same as that of step 502 to further remove a portion of the second dielectric region 442, and details thereof are omitted for the sake of brevity.

Referring to the example illustrated in FIG. 23, thereafter, steps 503 and 504 are repeated until the second dielectric region 442 shown in FIGS. 26 and 27 is removed completely, such that the dielectric layer 44 is patterned.

Figure 28:
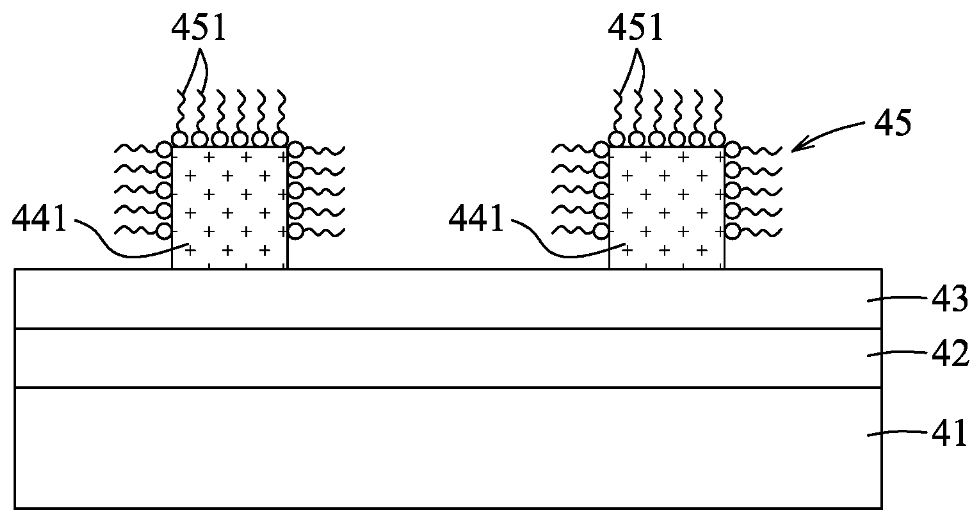
Figure 29:
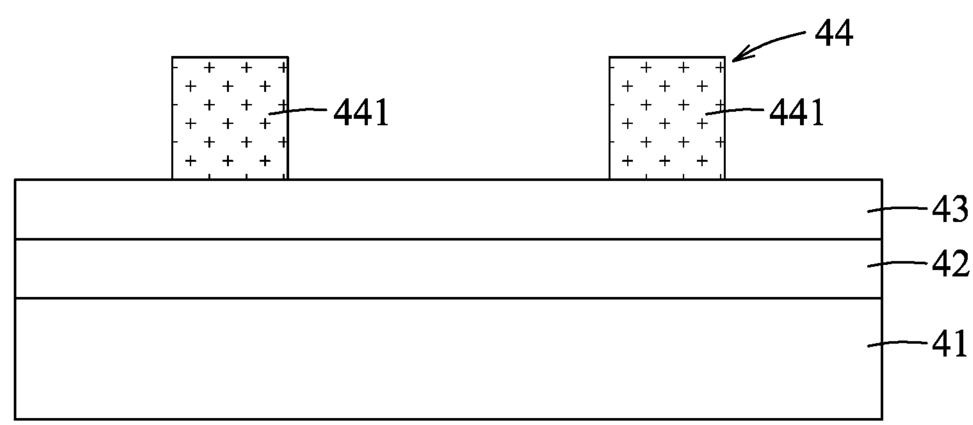

Referring to FIG. 23 and the examples illustrated in FIGS. 28 and 29, the method 500 proceeds to step 505, where an ashing process is conducted. The SAM 45 remaining on the first dielectric region 441 is removed by an ashing process. In some embodiments, the ashing process may be conducted in a manner the same as or similar to that described above with reference to FIGS. 15 and 16, and thus details thereof are omitted for the sake of brevity.

In a selective etching process of the present disclosure, a semiconductor device, which includes a first dielectric region and a second dielectric region including a dielectric material different from that of the first dielectric region, is treated with a self-assembled-monolayer-forming compound to form a self-assembled monolayer to selectively cover the first dielectric region so as to expose the second dielectric region. Thereafter, a dilute acid solution is used to selectively etch the second dielectric region while the first dielectric region is protected by the self-assembled monolayer from being etched by the dilute acid solution. The selective etching process of the present disclosure can be used not only in a front-end-of-line process in a method for manufacturing a semiconductor device, but also in a middle-end-of-line process and a back-end-of-line process without damaging metal features included in the semiconductor device.

In accordance with some embodiments of the present disclosure, a selective etching process includes:

forming a first dielectric region and a second dielectric region on a substrate, the first dielectric region including a first dielectric material, the second dielectric region including a second dielectric material different from the first dielectric material;

treating the first dielectric region and the second dielectric region with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof, (I)

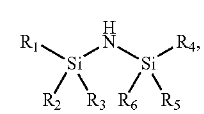

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from about 1 to about 5, (II)

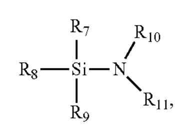

wherein $R_7$, $R_8$, $R_9$, $R_{10}$, and $R_{11}$ are the same as or different from each other, and each of $R_7$, $R_8$, $R_9$, $R_{10}$, and $R_{11}$ is independently an alkyl group of $C_nH_{2n+1}$, wherein n is an integer ranging from about 1 to about 5; and selectively etching the second dielectric region using a dilute acid solution as an etchant.

In accordance with some embodiments of the present disclosure, the self-assembled monolayer includes a plurality of covalent groups formed from the self-assembled-monolayer-forming compound. A minor amount of the covalent groups is formed on a surface of the second dielectric region. The selective etching process further includes:

treating the second dielectric region with an organoamine compound to remove the covalent groups from the surface of the second dielectric region, the organoamine compound including a tertiary amine represented by Formula (IV), (IV)

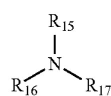

wherein $R_{15}$, $R_{16}$, and $R_{17}$ is the same as or different from each other, and each of $R_{15}$, $R_{16}$, and $R_{17}$ is independently an alkyl group of $C_nH_{2n+1}$, wherein n is an integer ranging from about 1 to about 15.

In accordance with some embodiments of the present disclosure, the first dielectric region includes silicon oxide, and the second dielectric region includes silicon nitride.

In accordance with some embodiments of the present disclosure, the first dielectric region and the second dielectric region are treated with the self-assembled-monolayer-forming compound at a temperature ranging from about 5° C. to about 70° C.

In accordance with some embodiments of the present disclosure, the first dielectric region and the second dielectric region are treated with the self-assembled-monolayer-forming compound for a time period ranging from about 0.1 minute to about 10 minutes.

In accordance with some embodiments of the present disclosure, the dilute acid solution includes a dilute aqueous solution of hydrofluoric acid having a hydrofluoric acid concentration ranging from about 0.05% to about 1%.

In accordance with some embodiments of the present disclosure, the second dielectric region is selectively etched at a temperature ranging from about 5° C. to about 50° C.

In accordance with some embodiments of the present disclosure, the second dielectric region is selectively etched for a time period ranging from about 0.1 minute to about 10 minutes.

In accordance with some embodiments of the present disclosure, the second dielectric region is treated with the organoamine compound at a temperature ranging from about 5° C. to about 70° C.

In accordance with some embodiments of the present disclosure, the second dielectric region is treated with the organoamine compound for a time period ranging from about 0.1 minute to about 10 minutes.

In accordance with some embodiments of the present disclosure, a method for manufacturing a semiconductor device includes:

forming a first dielectric region and a second dielectric region on a substrate, the first dielectric region including a first dielectric material, the second dielectric region including a second dielectric material different from the first dielectric material;

treating the first dielectric region and the second dielectric region with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof, (I)

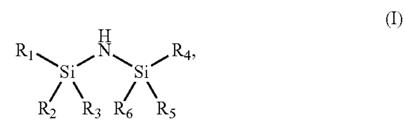

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from about 1 to about 5, (II)

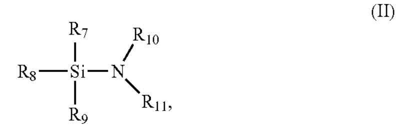

wherein $R_7$, $R_8$, $R_9$, $R_{10}$, and $R_{11}$ are the same as or different from each other, and each of $R_7$, $R_8$, $R_9$, $R_{10}$, and $R_1$ is independently an alkyl group of $C_nH_{2n+1}$, wherein n is an integer ranging from about 1 to about 5;

selectively etching the second dielectric region using a dilute acid solution as an etchant; and removing the self-assembled monolayer from the first dielectric region by an ashing process.

In accordance with some embodiments of the present disclosure, the self-assembled monolayer includes a plurality of covalent groups formed from the self-assembled-monolayer-forming compound. A minor amount of the covalent groups is formed on a surface of the second dielectric region. The method for manufacturing a semiconductor device further includes:

treating the second dielectric region with an organoamine compound to remove the covalent groups from the surface of the second dielectric region, the organoamine compound including a tertiary amine represented by Formula (IV), (IV)

$R_{15}$—N($R_{16}$)($R_{17}$)

wherein $R_{15}$, $R_{16}$, and $R_{17}$ is the same as or different from each other, and each of $R_{15}$, $R_{16}$, and $R_{17}$ is independently an alkyl group of $C_nH_{2n+1}$, wherein n is an integer ranging from about 1 to about 15.

In accordance with some embodiments of the present disclosure, the second dielectric region is selectively etched for a time period ranging from about 0.1 minute to about 10 minutes.

In accordance with some embodiments of the present disclosure, the ashing process is conducted using an $N_2/H_2$ plasma.

In accordance with some embodiments of the present disclosure, treating the first dielectric region and the second dielectric region with the self-assembled-monolayer-forming compound and selectively etching the second dielectric region are repeated.

In accordance with some embodiments of the present disclosure, a method for manufacturing a semiconductor device includes:

forming a dielectric layer on a substrate, the dielectric layer including a first dielectric region and a second dielectric region, the first dielectric region including a first dielectric material, the second dielectric region including a second dielectric material different from the first dielectric material;

treating the dielectric layer with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof, (I)

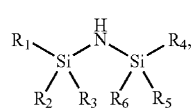

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from about 1 to about 5, (II)

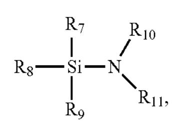

wherein $R_7$, $R_8$, $R_9$, $R_{10}$, and $R_{11}$ are the same as or different from each other, and each of $R_7$, $R_8$, $R_9$, $R_{10}$, and $R_1$ is independently an alkyl group of $C_nH_{2n+1}$, wherein n is an integer ranging from about 1 to about 5;

removing the second dielectric region by a selective etching process using a dilute acid solution as an etchant to form a patterned dielectric layer; and removing the self-assembled monolayer from the first dielectric region by an ashing process.

In accordance with some embodiments of the present disclosure, the dielectric layer is treated with the self-assembled-monolayer-forming compound for a time period ranging from about 0.1 minute to about 10 minutes.

In accordance with some embodiments of the present disclosure, the second dielectric region is selectively etched for a time period ranging from about 0.1 minute to about 10 minutes.

In accordance with some embodiments of the present disclosure, the ashing process is conducted using an $N_2/H_2$ plasma.

In accordance with some embodiments of the present disclosure, treatment of the first dielectric region and the second dielectric region with the self-assembled-monolayer-forming compound and the selectively etching process are repeated.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A selective etching process comprising:

forming a first dielectric region and a second dielectric region on a substrate, the first dielectric region including a first dielectric material, the second dielectric region including a second dielectric material different from the first dielectric material;

treating the first dielectric region and the second dielectric region with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof, (I)

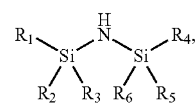

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from 1 to 5, (II)

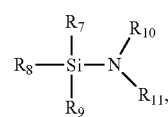

wherein $R_7$, $R_8$, $R_9$, $R_{10}$, and $R_{11}$ are the same as or different from each other, and each of $R_7$, $R_8$, $R_9$, $R_{10}$, and $R_1$ is independently an alkyl group of $C_nH_{2n+1}$, wherein n is an integer ranging from 1 to 5; and selectively etching the second dielectric region using a dilute acid solution as an etchant.

2. The selective etching process according to claim 1, wherein the self-assembled monolayer includes a plurality of covalent groups formed from the self-assembled-monolayer-forming compound, a minor amount of the covalent groups being formed on a surface of the second dielectric region, the selective etching process further comprising:

treating the second dielectric region with an organoamine compound to remove the covalent groups from the surface of the second dielectric region, the organoamine compound including a tertiary amine represented by Formula (IV),

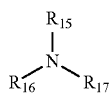

(IV)

wherein $R_{15}$, $R_{16}$, and $R_{17}$ is the same as or different from each other, and each of $R_{15}$, $R_{16}$, and $R_{17}$ is independently an alkyl group of $C_nH_{2n+1}$, wherein n is an integer ranging from 1 to 15.

3. The selective etching process according to claim 1, wherein the first dielectric region includes silicon oxide, and the second dielectric region includes silicon nitride.

4. The selective etching process according to claim 1, wherein the first dielectric region and the second dielectric region are treated with the self-assembled-monolayer-forming compound at a temperature ranging from 5° C. to 70° C.

5. The selective etching process according to claim 1, wherein the first dielectric region and the second dielectric region are treated with the self-assembled-monolayer-forming compound for a time period ranging from 0.1 minute to 10 minutes.

6. The selective etching process according to claim 1, wherein the dilute acid solution includes a dilute aqueous solution of hydrofluoric acid having a hydrofluoric acid concentration ranging from 0.05% to 1%.

7. The selective etching process according to claim 1, wherein the second dielectric region is selectively etched at a temperature ranging from 5° C. to 50° C.

8. The selective etching process according to claim 1, wherein the second dielectric region is selectively etched for a time period ranging from 0.1 minute to 10 minutes.

9. The selective etching process according to claim 2, wherein the second dielectric region is treated with the organoamine compound at a temperature ranging from 5° C. to 70° C.

10. The selective etching process according to claim 2, wherein the second dielectric region is treated with the organoamine compound for a time period ranging from 0.1 minute to 10 minutes.

11. A method for manufacturing a semiconductor device comprising:

forming a first dielectric region and a second dielectric region on a substrate, the first dielectric region including a first dielectric material, the second dielectric region including a second dielectric material different from the first dielectric material;

treating the first dielectric region and the second dielectric region with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof,

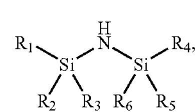

(I)

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from 1 to 5,

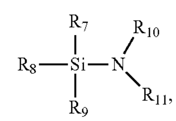

(II)

wherein $R_7$, $R_8$, $R_9$, $R_{10}$, and $R_{11}$ are the same as or different from each other, and each of $R_7$, $R_8$, $R_9$, $R_{10}$, and $R_{11}$ is independently an alkyl group of $C_nH_{2n+1}$, wherein n is an integer ranging from 1 to 5;

selectively etching the second dielectric region using a dilute acid solution as an etchant; and removing the self-assembled monolayer from the first dielectric region by an ashing process.

12. The method according to claim 11, wherein the self-assembled monolayer includes a plurality of covalent groups formed from the self-assembled-monolayer-forming compound, a minor amount of the covalent groups being formed on a surface of the second dielectric region, the method further comprising:

treating the second dielectric region with an organoamine compound to remove the covalent groups from the surface of the second dielectric region, the organoamine compound including a tertiary amine represented by Formula (IV),

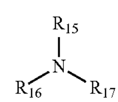

(IV)

wherein $R_{15}$, $R_{16}$, and $R_{17}$ is the same as or different from each other, and each of $R_{15}$, $R_{16}$, and $R_{17}$ is independently an alkyl group of $C_nH_{2n+1}$, wherein n is an integer ranging from 1 to 15.

13. The method according to claim 11, wherein the second dielectric region is selectively etched for a time period ranging from 0.1 minute to 10 minutes.

14. The method according to claim 11, wherein the ashing process is conducted using an $N_2/H_2$ plasma.

15. The method according to claim 11, wherein treating the first dielectric region and the second dielectric region with the self-assembled-monolayer-forming compound and selectively etching the second dielectric region are repeated.

16. A method for manufacturing a semiconductor device comprising:

forming a dielectric layer on a substrate, the dielectric layer including a first dielectric region and a second dielectric region, the first dielectric region including a first dielectric material, the second dielectric region including a second dielectric material different from the first dielectric material;

treating the dielectric layer with a self-assembled-monolayer-forming compound to selectively form a self-assembled monolayer on the first dielectric region so as to expose the second dielectric region, the self-assembled-monolayer-forming compound including a disilazane compound represented by Formula (I), a silane compound represented by Formula (II), or a combination thereof, (I)

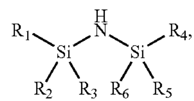

wherein $R_1$, $R_2$, $R_3$, $R_4$, $R_5$, and $R_6$ are the same as or different from each other, and each of $R_1$, $R_2$, $R_3$, $R_4$, $R_5$, and $R_6$ is independently an alkyl group of $C_nH_{2n+1}$, wherein n is an integer ranging from 1 to 5, (II)

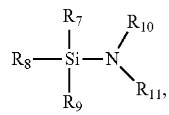

wherein $R_7$, $R_8$, $R_9$, $R_{10}$, and $R_{11}$ are the same as or different from each other, and each of $R_7$, $R_8$, $R_9$, $R_{10}$, and $R_1$ is independently an alkyl group of $C_nH_{2n+1}$, wherein n is an integer ranging from 1 to 5;

removing the second dielectric region by a selective etching process using a dilute acid solution as an etchant to form a patterned dielectric layer; and removing the self-assembled monolayer from the first dielectric region by an ashing process.

17. The method according to claim 16, wherein the dielectric layer is treated with the self-assembled-monolayer-forming compound for a time period ranging from 0.1 minute to 10 minutes.

18. The method according to claim 16, wherein the second dielectric region is selectively etched for a time period ranging from 0.1 minute to 10 minutes.

19. The method according to claim 16, wherein the ashing process is conducted using an $N_2/H_2$ plasma.

20. The method according to claim 16, wherein treatment of the first dielectric region and the second dielectric region with the self-assembled-monolayer-forming compound and the selectively etching process are repeated.

* * * * *